United States Patent [19]

Davis

[11] Patent Number: 4,571,708
[45] Date of Patent: Feb. 18, 1986

[54] CMOS ROM DATA SELECT CIRCUIT
[75] Inventor: Harold L. Davis, The Colony, Tex.
[73] Assignee: Mostek Corporation, Carrollton, Tex.
[21] Appl. No.: 686,330
[22] Filed: Dec. 26, 1984
[51] Int. Cl.⁴ ............................................. G11C 11/40
[52] U.S. Cl. .................................... 365/203; 365/182
[58] Field of Search ................ 365/182, 189, 203, 230

[56] References Cited
FOREIGN PATENT DOCUMENTS
0159897 12/1981 Japan .................................. 365/104
0083392 5/1983 Japan .................................. 365/104

Primary Examiner—James W. Moffitt
Attorney, Agent, or Firm—Eric W. Petraske

[57] ABSTRACT

A data select circuit for selecting a column line in a CMOS ROM and for establishing a connection between a pair of bit lines and corresponding data lines uses a single NMOS pull-down transistor on the column line and a pair of P-channel pass transistors on the bit lines, the pass transistor gates being controlled not by an inverted column decode line, but by the column line itself, thus reducing the capacitive load on the column decoder and saving space.

1 Claim, 3 Drawing Figures

CMOS ROM DATA SELECT CIRCUIT

DESCRIPTION

1. Technical Field

The field of the invention is that of CMOS integrated circuit ROMs.

2. Background Art

In conventional NMOS ROMs, the memory matrix comprises a set of column lines connected through a pair of data storage transistors to adjacent bit lines. In operation, the column line is pulled to ground, thus creating a potential path through the intermediate transistors from the bit lines, which remain near five volts, to ground at the column line. Since column lines and bit lines alternate, the column decode line outside the memory matrix controls three gates per column—the column line in question and pass transistors connecting the two adjacent bit lines with corresponding data lines. The use of the NMOS technology means that the full value of VCC cannot be used on the bit lines because there is a threshold drop on the pass transistor between the bit line and the data line. The value of the voltage on the bit lines may vary across the chip as a result of Vt variation.

SUMMARY OF THE INVENTION

The invention relates to a data selection circuit adapted for a CMOS ROM, in which P-channel pass transistors on the bit lines have gates that are connected directly to the intermediate column line. The column decode line then controls only one transistor per column line—that on the column line. When the column line drops to ground, the initially off P-channel pass transistors create a path that will pass the full voltage value of VCC, which is uniform across the chip.

Ordinarily, to perform this function, a CMOS ROM would need an inverter to invert the signal on the column decoder line and a second line paralleling the column decode line to control the gates of the P-channel pass transistors on the bit lines. There would, therefore, be twice as many lines in the controlling circuit.

BEST MODE OF CARRYING OUT THE INVENTION

Figure 1:
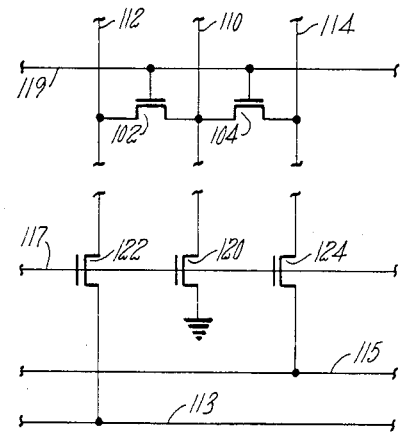
FIG. 1 illustrates a data select circuit in the prior art.

Referring to FIG. 1, the prior art circuit described above is shown, in which column line 110 is bracketed by bit lines 112 and 114, connected by data storage transistors 102 and 104 is shown in this figure. In addition a word line 119 is connected to the gates of transistors 102 and 104. There will, of course, be many more to be distributed throughout a memory matrix. The operation of the column is controlled by column decode line 117 which controls pull-down transistor 120 and pass transistors 122 and 124. Transistor 120 pulls down the column line to ground and transistors 122 and 124 create a path between data lines 113 and 115 and bit lines 112 and 114 respectively. Since a voltage no higher than VCC minus the Vt of the pass transistor can pass between the bit lines and their data lines, this forces the bit lines to be precharged to this lower voltage level instead of all the way to VCC, the preferred CMOS level.

Figure 2:
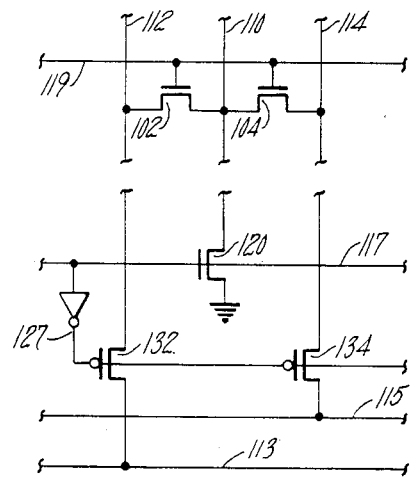
FIG. 2 illustrates a straightforward circuit employing P-channel pass transistors.

Referring now to FIG. 2, a CMOS circuit which allows bit lines to be fully precharged to VCC by using P-channel pass gates is shown, with similar elements indicated by the same numeral. In operation, the column line and the two bit lines are all precharged to VCC by conventional means that form no part of this invention. The P-channel pass gates 132 and 134 which have replaced the N-channel pass gates 122 and 124 from FIG. 1 may now pass the full VCC from bit lines to data lines, but their gates must be driven by a new signal on column decode line 127, the inversion of the signal on column decode line 117. This requires twice as many column decode lines as the version in FIG. 1, because both true and complement decode lines must be used for each column circuit, with the true line driving the pulldown transistor and the complement driving the pass gates.

Figure 3:
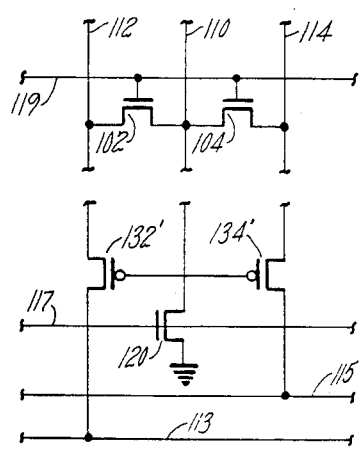
FIG. 3 illustrates an embodiment of the invention.

Referring to FIG. 3, there is shown an embodiment of the invention in which, again, similar elements are indicated by the same numeral. The function of the circuit is the same as in FIG. 2, but the P-channel pass gates are driven, not by a complement column decode signal, but by the column line 110. In this emboiment, the column line 110 and its pulldown transistor 120 are being used both for their column line functions and as a dynamic inverter to locally create the necessary column decode line inversion to drive the P-channel pass gates, thus doing away with the need for the complement column decode line 127 shown in FIG. 2. The advantages of the embodiment shown in FIG. 3 over the circuits in FIGS. 1 and 2 are as follows: Unlike FIG. 1, the invention allows bit lines to be precharged completely to VCC by using P-channel pass gates instead of N-channel. This will result in uniform bit-line precharge voltage across the chip, in contrast to the prior art, in which the threshold will vary.

Unlike FIG. 1, the invention has less capacitance on line 117 because only one transistor is connected per column line instead of three. In large chips, where a decode line may control more than a hundred columns, this reduction is significant.

Unlike FIG. 2, the invention does not require the complement column decode line to be generated and run to the P-channel pass gates.

Unlike the embodiments of both FIGS. 1 and 2, the invention places the pass gates, which are of negligible capacitance separately but of sizeable capacitance as a group, separately on each column line. Since the capacitance of the column line is much higher than that of the two pass gates, the effect is also negligible upon the operation of the column line.

As a further advantage, pass transistors 132' and 134' in the embodiment of FIG. 3 are wider, so that there is lower impedance (or better charge transfer) to the data line so that the quality of the signal to the sense amplifier or other sensing device is improved.

This invention has been described with respect to an embodiment in which the column line is brought to ground through an N-channel transistor and the bit lines have P-channel transistors to rise to VCC. As is known in the art, an equivalent circuit could be constructed in which all the voltages and polarities are reversed i.e. a P-channel pull-up transistor on the column line pulls it to VCC and N-channel pass transistors on the bit line go all the way to ground during the set up stage. In the following claims, channel polarity references and voltage references shall be deemed also to refer to their opposites.

I claim:

1. A data selection circuit for a CMOS memory integrated circuit having a column line bracketed by first and second bit lines and having at least one pair of data storage transistors connected respectively between said column line and said first bit line and between said column line and said second bit line, each pair of said at least one pair of data storage transistors having a gate connected to a common row line of a set of at least one row line, said column line being connected through an N-channel pull-down transistor to ground and each of said bit lines being connected through a P-channel pass transistor to first and second data lines, respectively, in which said pull-down transistor has a gate electrode connected to a column decode line and each of said pass transistors has a gate connected to said column line, whereby a transition from a positive voltage to ground on said column line in response to a signal on said column decode line turns on said P-channel pass transistors, establishing a current path between each of said bit lines and a corresponding data line.

* * * * *